United States Patent
Yamagata

(10) Patent No.: US 7,157,796 B2
(45) Date of Patent: Jan. 2, 2007

(54) SEMICONDUCTOR DEVICE AND THE METHOD OF PRODUCING THE SAME

(75) Inventor: Osamu Yamagata, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/989,395

(22) Filed: Nov. 17, 2004

(65) Prior Publication Data

US 2005/0127512 A1   Jun. 16, 2005

(30) Foreign Application Priority Data

Dec. 12, 2003   (JP)   ............................ P2003-415516

(51) Int. Cl.
   *H01L 29/74*   (2006.01)
(52) U.S. Cl. ...................... 257/758; 257/730; 257/678; 257/781; 257/620; 257/618; 257/790; 257/787; 257/788; 257/789
(58) Field of Classification Search ................ 257/758, 257/730, 678, 781, 620, 618, 790, 787, 788, 257/798
See application file for complete search history.

(56) References Cited

U.S. PATENT DOCUMENTS 5,795,815 A * 8/1998 Vokoun et al. ............. 438/462
6,600,234 B1 * 7/2003 Kuwabara et al. .......... 257/790
6,633,081 B1 * 10/2003 Sahara et al. ............... 257/738

\* cited by examiner

*Primary Examiner*—Eddie Lee
*Assistant Examiner*—Junghwa Im
(74) *Attorney, Agent, or Firm*—Rader Fishman & Grauer PLLC; Ronald P. Kananen

(57) ABSTRACT

A SiP type semiconductor device and a method of producing the same is provided wherein curvature of a wafer is suppressed in the production steps, workability does not decline, and high throughput can be attained. An insulation layer is formed by stacking a plurality of resin layers on a semiconductor substrate, wiring layers are formed by being buried in the insulation layer so as to be connected to an electronic circuit, an insulating buffer layer for buffering a stress generated at the time of being mounted on a board is formed on the insulation layer, a conductive post is formed through the buffer layer and connected to the wiring layer, and a projecting electrode is formed projecting from a surface of the buffer layer and connected to the conductive post.

7 Claims, 13 Drawing Sheets

10a  ···  SEMICONDUCTOR SUBSTRATE
20,21,22,23  ···  RESIN LAYER (INSULATION LAYER)
24  ···  BUFFER LAYER
30~35  ···  WIRING LAYER
36  ···  CONDUCTIVE POST
37  ···  PROJECTING ELECTRODE (BUMP)

PRIOR ART

10a ··· SEMICONDUCTOR SUBSTRATE
20,21,22,23 ··· RESIN LAYER (INSULATION LAYER)
24 ··· BUFFER LAYER
30~35 ··· WIRING LAYER
36 ··· CONDUCTIVE POST
37 ··· PROJECTING ELECTRODE (BUMP)

SEMICONDUCTOR DEVICE AND THE METHOD OF PRODUCING THE SAME

BACKGROUND OF THE INVENTION

1. Field of the Invention

The present invention relates to a semiconductor device and a method of producing the same. More particularly, the present invention relates to a semiconductor device of a type called a system-in-package (SiP), which is packaged at a wafer level, and a method of producing the same.

2. Description of the Related Art

Demands for more compact, thinner and lighter portable electronic devices, such as a digital video camera, a digital cellular phone and a notebook computer, continue to increase. To respond thereto, seven tenths of reduction has been realized in three years in recent VLSI and other semiconductor devices, while studies and developments have been made on a significant issue of how to improve packaging density of components on a board (printed wiring board) in an electronic circuit device wherein such a semiconductor device is mounted on a printed wiring board.

For example, a package type of a semiconductor device has shifted from the lead inserted type, such as a dual inline package (DIP), to the surface mounted type and, furthermore, a flip-chip mounting method for providing a bump (projecting electrode) made of solder or gold on a pad electrode of a semiconductor chip and connecting to the wiring board via the-bump with the surface directing downward has been developed.

In the above semiconductor device, when forming multilayer wiring, also known as the re-wiring of layers on the semiconductor substrate (chip), for example, an insulating layer is formed to have a film thickness of 1 μm or less on a surface of a semiconductor wafer having formed therein a transistor and another semiconductor element by the chemical vapor deposition (CVD) method, the sputtering method, the thermal oxidization method or the spin coating, etc., and dicing processing is performed to obtain a small piece of the semiconductor device.

In the above production method, even when a step is generated on the insulating layer and a curvature arises on the wafer, it has been sufficient to watch out only for the blade and chipping during dicing, such that it has been unnecessary to give attention to the step disconnection of a resist and the curvature of the wafer.

Furthermore, the development of a complicated type of package called a system-in-package (SiP) has advanced, wherein a passive element, such as a coil, and another semiconductor chip are buried in an interlayer of an insulating layer for insulating re-wiring layers formed on a semiconductor substrate (chip) and packaged at a wafer level.

A method for producing the SiP includes, for example, stacking a plurality of insulation layers made by a polyimide resin, etc. on a surface of a semiconductor wafer having formed therein a transistor and another semiconductor element and forming wiring by burying between the respective insulation layers, resulting in a configuration wherein a re-wiring layer composed of a plurality of wiring layers is formed by burying in the insulation layers. The insulation layers and the semiconductor wafer are cut along a scribe line (dicing), so that a semiconductor made to be a SiP on the wafer level can be produced.

As to the above plurality of insulation layers, even when a film thickness per one layer is made to be at least 10 μm, it becomes 30 μm when three of these layers are stacked. When forming a coil and another passive element between the insulation layers and when burying a semiconductor chip, it becomes even thicker. Thus, for example, if the semiconductor wafer (substrate) is made to be as thin as 50 μm or so, relatively, the film thickness of insulation layers of the re-wiring layer cannot be ignored and a curvature arises on the semiconductor wafer due to, for example, a difference of thermal expansion coefficients between the semiconductor wafer and the insulation layer portion.

Therefore, in a SiP type semiconductor device configured by stacking a plurality of resin layers on a semiconductor chip and burying re-wiring layers in the resin layers, a semiconductor device formed to be a stepwise shape by sides and upper surfaces of respective resin layers and an upper surface of a semiconductor chip has been developed.

FIG. 1A is a sectional view around a scribe line of a semiconductor wafer on which a plurality of semiconductor chips are integrated to form the above semiconductor device.

In each semiconductor chip region of the semiconductor wafer 10 on which semiconductor chips having an electronic circuit formed therein including a transistor or other semiconductor element are integrated, an insulation layer configured by stacking a first resin layer 20, a second resin layer 21, a third resin layer 22 and a fourth resin layer 23, a wiring layer composed of a first wiring layer (30, 31), a second wiring layer (32, 33) and a third wiring layer (34 and 35) are formed by being buried in the insulation layer composed of these stacked resin layers, and a wiring layer (not shown) connected thereto is formed also on the fourth resin layer 23.

In the semiconductor wafer 10 on which the above semiconductor chips are integrated, side surfaces and upper surfaces of the respective resin layers and an upper surface of the semiconductor wafer are formed as a stepwise shape, and a scribe line L is exposed, so that stress in not imposed upon the semiconductor wafer and curvature does not arise.

On the other hand, in the above SiP type semiconductor device, there is known the configuration of providing a buffer layer having a stress buffering function to improve secondary connection reliability with a board, and connecting to a bump, such as solder, via a post made of copper through the buffer layer.

Steps below are performed to form a buffer layer, a post and a bump on the semiconductor wafer having the configuration shown in FIG. 1A.

First, as shown in FIG. 1B, the post 36 made of copper is formed by connecting to a wiring layer (not shown) formed on the fourth resin layer 23 on the semiconductor wafer 10 on which semiconductor chips are integrated to be the configuration as shown in FIG. 1A.

Next, as shown in FIG. 2A, a resin having a stress buffering function, such as a polyamideimide resin, is supplied all over the post 36, for example, by a screen printing method, etc. to form the buffer layer 24. The buffer layer 24 is formed by burying the scribe line.

Next, as shown in FIG. 2B, the top of the post 36 is exposed on the upper surface of the buffer layer 24 by polishing, furthermore, a bump 37, such as a solder ball, is formed to be connected to the post 36.

Next, as shown in FIG. 3, by cutting (dicing) the semiconductor wafer 10 along scribe lines SL using a dicing blade B, a semiconductor device made to form a SiP on the wafer level of a bump connection type via the buffer layer can be produced.

However, as shown in FIG. 2A, when the buffer layer is formed all over by burying the scribe lines, curvature arises-on the semiconductor wafer due to the same reasons curvature arises when an insulation layer of a resin is formed all over.

Curvature arising on the semiconductor wafer may cause any number of problems, including a mounting defect of a solder ball to be mounted as the above bump 37, unevenness of height when forming bumps by printing, adsorption error of a handling apparatus in a wiring step of the upper layer and in a plating step, and unevenness of height when the wafer is finally cut into pieces.

Also, the scribe lines are hidden by the buffer layer, and alignment marks and a name of a type of the production to be produced normally formed on the scribe lines cannot be seen.

Therefore, in the cutting (dicing) step shown in FIG. 3, positions of the bumps have to be alignment targets of scribe, which causes a mistake in the dicing operation such that workability declines.

Furthermore, there is no other way to confirm the name of the type of the semiconductor wafer other than by confirming the positions of the bumps, resulting in further decreases in workability.

Furthermore, in the cutting (dicing) step shown in FIG. 3, since the buffer layer and the semiconductor substrate are cut together, the cutting speed of the dicing can be raised only as high as 10 mm/s or so, and throughput of the production steps is hard to improve.

SUMMARY OF THE INVENTION

An object of the present invention is to provide a SiP type semiconductor device in the case of a device having a bump connection via a buffer layer, wherein curvature of a wafer is suppressed so as to improve workability and throughput.

According to the present invention, there is provided a semiconductor device including and packaging a semiconductor having an electronic circuit formed therein and used when mounted on a board, comprising a substrate; an insulation layer formed of a plurality of resin layers stacked on the substrate on a region other than an outer circumferential portion of the substrate; a wiring layer formed to be electrically connected to the electronic circuit and buried in the insulation layer; an insulating buffer layer formed on the insulation layer on a region not exceeding a formation region of the resin-layer formed with the largest area among the plurality of the resin layers, and for buffering a stress which is generated when mounted on the board; a conductive post formed through the buffer layer to be electrically connected to the wiring layer; and a projecting electrode formed projecting from a surface of the buffer layer to be electrically connected to the conductive post.

In the semiconductor device above which includes and packages a semiconductor having an electronic circuit formed therein and used when mounted on a board, an insulation layer is formed by stacking a plurality of resin layers on a substrate, a wiring layer is formed by being buried in the insulation layer so as to be connected to an electronic circuit, an insulating buffer layer for buffering a stress generated at the time of being mounted on a board is formed on the insulation layer, and a conductive post is formed through the buffer layer and connected to the wiring layer, and a projecting electrode is formed projecting from a surface of the buffer layer and connected to the conductive post.

Here, resin layers composing the insulation layer are formed on a region excluding an outer circumferential portion of the semiconductor substrate, and the buffer layer is formed on a region not exceeding a formation region of a resin layer having the largest area among the plurality of resin layers.

Also, according to the present invention, there is provided a method of producing a semiconductor device including and packaging a semiconductor having an electronic circuit formed therein and used when mounted on a board, comprising the steps of forming an insulation layer formed by stacking a plurality of resin layers on a surface of the substrate excluding a scribe line and forming a wiring layer electrically connected to the electronic circuit and buried in the insulation layer; forming a conductive post electrically connected to the wiring layer on the insulation layer; forming an insulating buffer layer buffering a stress which is generated when the semiconductor device is mounted on the board on the insulation layer in a region not exceeding a formation region of the resin layer formed with the largest area among the plurality of the resin layers and at an outer circumferential portion of the conductive post; and dicing the substrate on the scribe line.

The production method of a semiconductor device of the present invention above is a production method of a semiconductor device including and packaging a semiconductor having an electronic circuit formed therein and used when mounted on a board, wherein an insulation layer formed by stacking a plurality of resin layers is formed first on a surface of a substrate excluding the scribe line and a wiring layer for being connected to the electronic circuit is formed by being buried in the insulation layer.

Next, a conductive post for being connected to the wiring layer is formed on the insulation layer, and an insulating buffer layer for buffering a stress generated when the semiconductor device is mounted on the board is formed on an outer circumferential portion of the conductive post and on a region not exceeding a formation region of a resin layer having the largest area among the plurality of resin layers on the insulation layer. Furthermore, the substrate is cut on the scribe line.

A semiconductor device of the present invention is a SiP type semiconductor device of a type with bump connection via a buffer layer, configured so that neither an insulation layer nor a buffer layer are formed on an outer circumferential portion of the substrate. Accordingly, the insulation layer and buffer layer are not formed on scribe lines on the substrate before dicing, so that curvature of the substrate is suppressed, and the scribe lines can be visually recognized, so that the workability is not declined and the dicing speed can be made high to attain a high throughput.

In a method of producing a semiconductor device of the present invention, when producing a SiP type semiconductor device of a type having bump connection via a buffer layer, the insulation layer and buffer layer are not formed on scribe lines on the substrate before dicing, so that curvature of the substrate is suppressed, and the scribe lines can be visually recognized, so that the workability is not declined and the dicing speed can be made high to attain a high throughput.

BRIEF DESCRIPTION OF DRAWINGS

These and other objects and features of the present invention will become clearer from the following description of the preferred embodiments given with reference to the attached drawings, in which.

DESCRIPTION OF THE PREFERRED EMBODIMENT

Below, a semiconductor device and a method of producing the same according to an embodiment of the present invention will be explained with reference to the drawings.

Figure 1A:
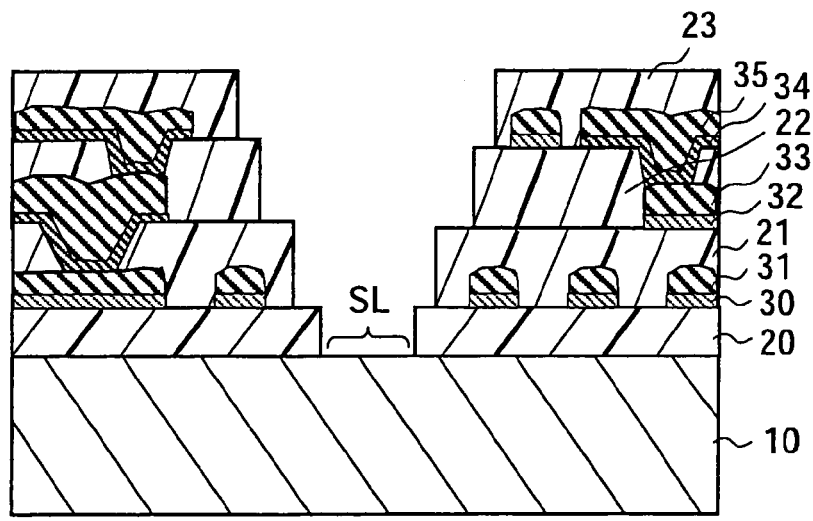
FIG. 1A and FIG. 1B are sectional views of a production method of a semiconductor device according to the related art.
Figure 1B:
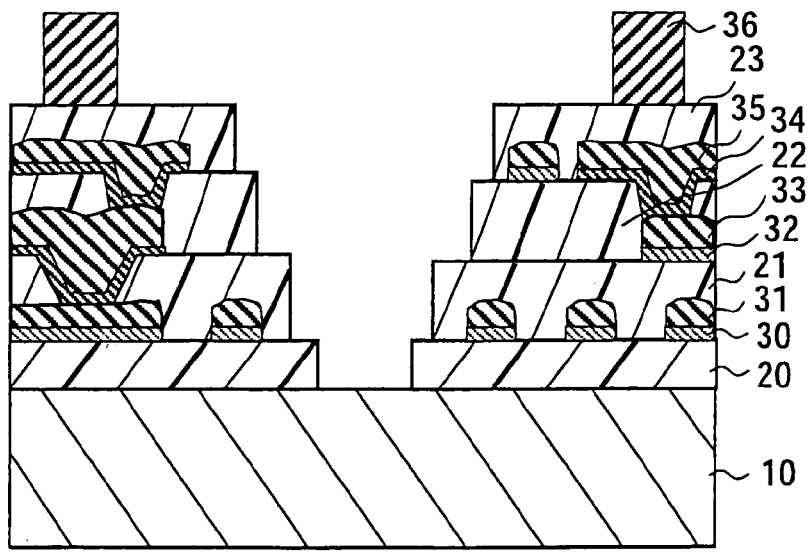
Figure 2A:
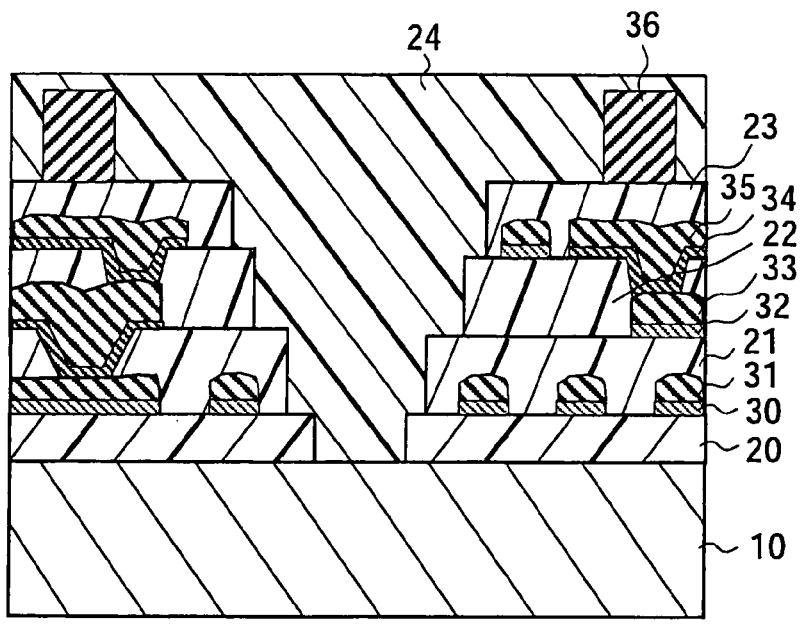
FIG. 2A and FIG. 2B are sectional views of a production method of a semiconductor device according to the related art.
Figure 2B:
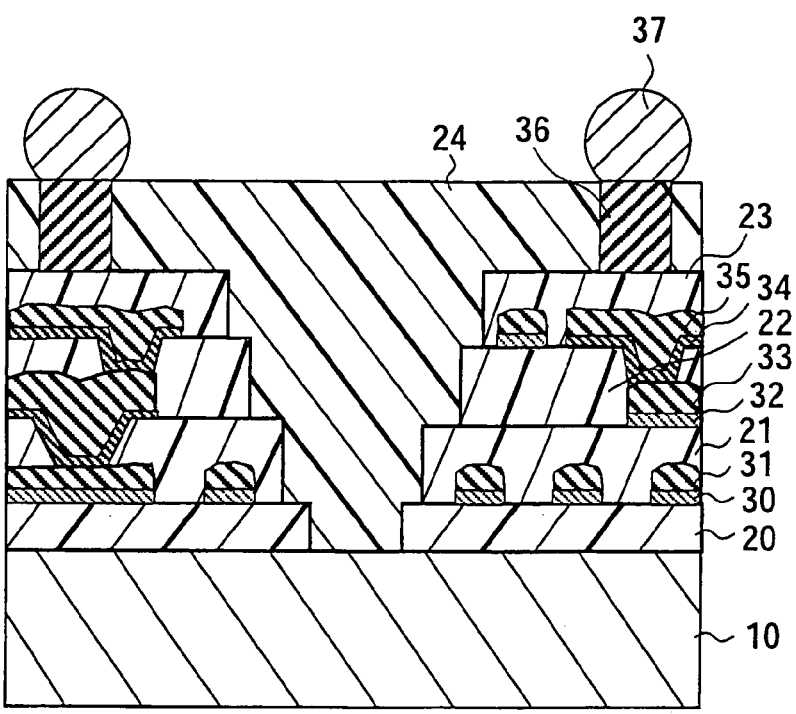
Figure 3:
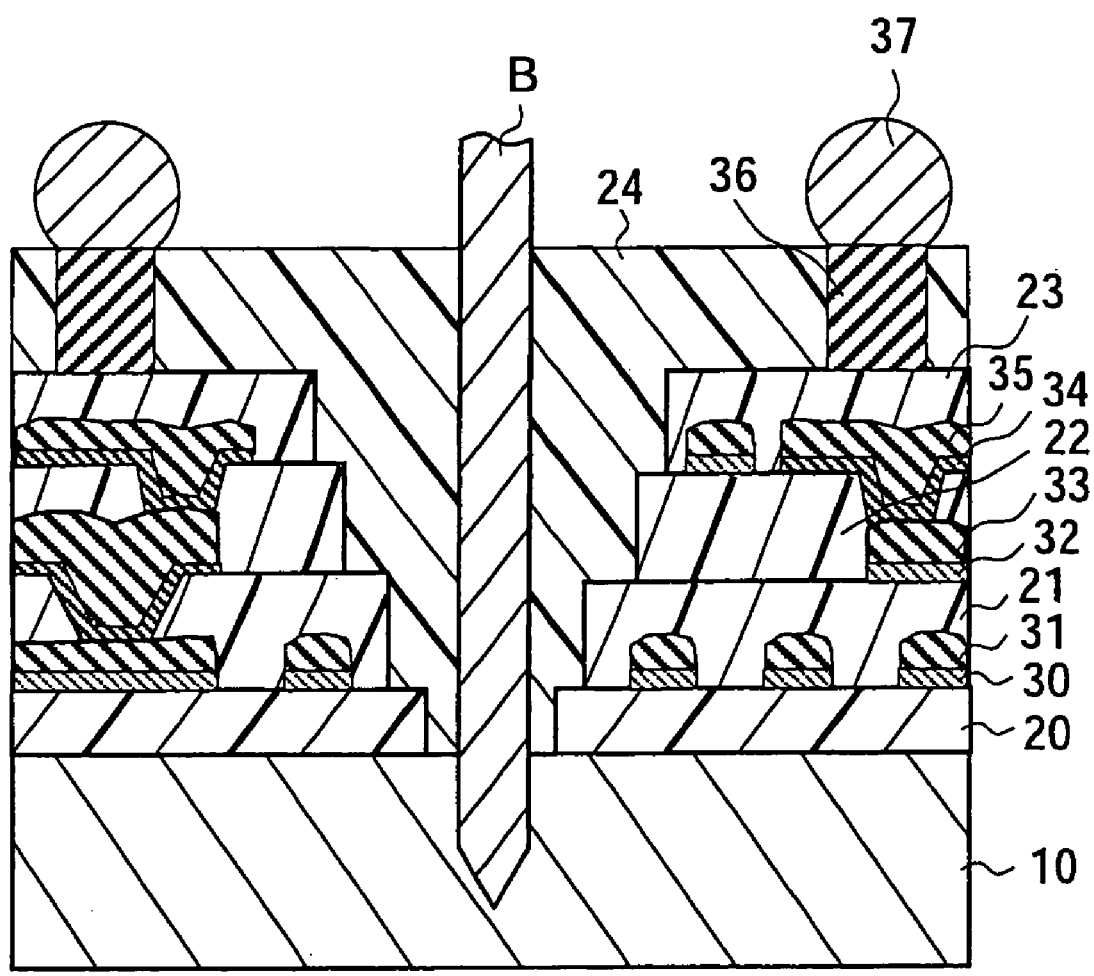
FIG. 3 is a sectional view of a production method of a semiconductor device according to the related art.
Figure 4:
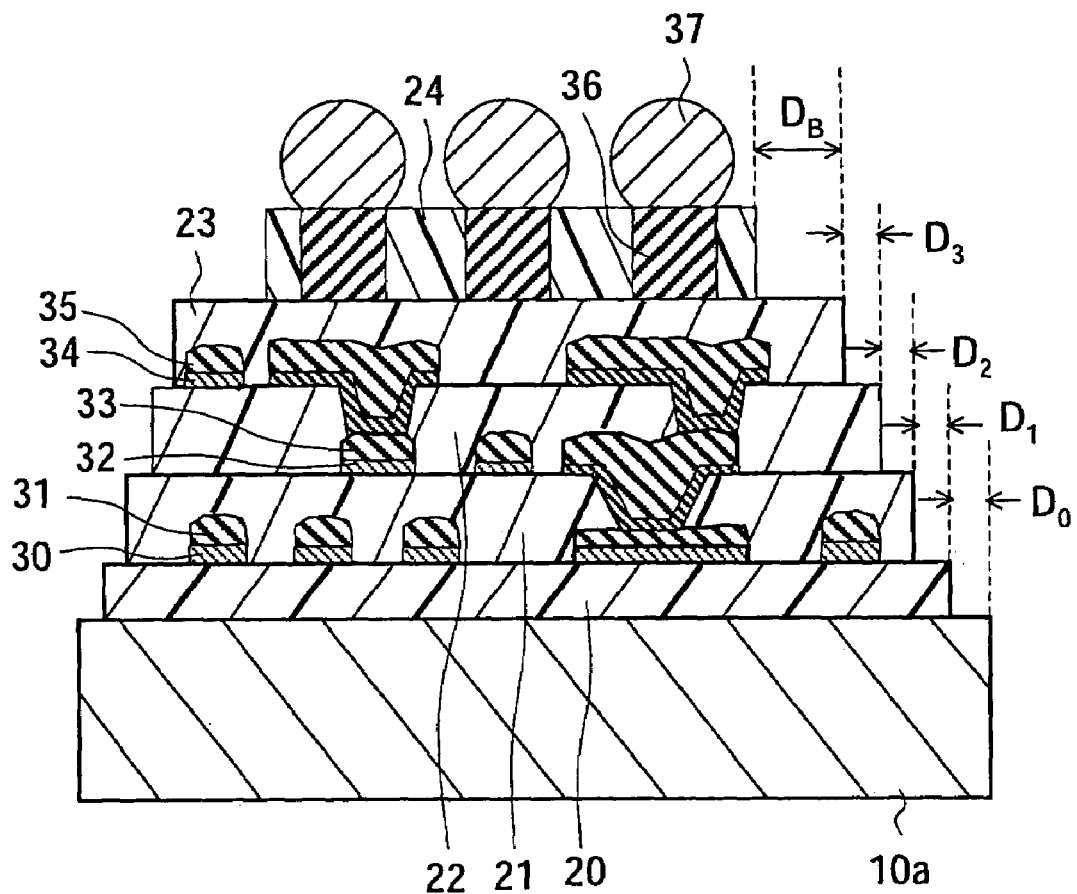
FIG. 4 is a cross-sectional view of a semiconductor device according to an embodiment of the present invention.

FIG. 4 is a schematic sectional view of a semiconductor device according to the present embodiment.

On a surface of a semiconductor substrate (substrate) 10a made by silicon formed an electronic circuit therein including a transistor or other semiconductor element, electrodes (not shown) taken out from the electronic circuit are formed, and on the semiconductor substrate 10a is formed an insulation layer, wherein a first resin layer 20, a second resin layer 21, a third resin layer 22 and a fourth resin layer 23 are stacked.

A wiring layer composed of a first wiring layer (30, 31), a second wiring layer (32, 33), a third wiring layer (34, 35) is formed by being buried in the insulation layer made by the stacked resin layers. The wiring layer is formed by electrically connecting to an electrode taken out from the electronic circuit of the semiconductor substrate 10a on a portion not illustrated.

Also, an insulating buffer layer 24 for buffering stress generated at the time of being mounted on a board is formed on a resin layer (the fourth resin layer 23) as the uppermost layer composing the insulation layer.

A conductive post 36 is formed by penetrating the buffer layer 24. The conductive post 36 is electrically connected to the wiring layer composed of the first to third wiring layers (30 to 35) in a portion not illustrated. Furthermore, bump (projecting electrode) 37 is formed projecting from the surface of the buffer layer 24 and to be connected to the conductive post 36.

In the above configuration, the insulation layer composed of the first resin layer 20, the second resin layer 21, the third resin layer 22 and the fourth resin layer 23 is formed on regions excluding the outer circumferential portion of the semiconductor substrate 10a.

In the present embodiment, for example, an area for forming the insulation layer composed of the first resin layer 20, the second resin layer 21, the third resin layer 22 and the fourth resin layer 23 becomes gradually smaller from the upper surface area of the semiconductor substrate 10a as it gets farther from the semiconductor substrate 10a, so that a side surface and an upper surface of each of the first resin layer 20, the second resin layer 21, the third resin layer 22 and the fourth resin layer 23 and an upper surface of the semiconductor substrate 10a form a stepwise shape.

Each of widths ($D_1$, $D_2$ and $D_3$) of exposed upper surfaces of the respective resin layers (20, 21 and 22) on the stepwise formed portion is preferably 5 µm or more, and is, for example, 5 µm. Note that a width $D_0$ of an exposed part of the semiconductor substrate 10a being out of the first resin layer 20 depends on a width of the scribe line on the semiconductor wafer before dicing, and is, for example, 10 µm or so. When the above widths ($D_1$, $D_2$ and $D_3$) are 5 µm or more, coverage of a resist film covering over the scribe line becomes preferable in the production method.

Also, the buffer layer 24 is formed on a region not exceeding the formation region of the resin layer provided to have the largest area among the first to fourth resin layers (20 to 23) composing the insulation layer.

In the present embodiment, the buffer layer 24 is formed on the uppermost resin layer (the fourth resin layer 23) on a region, for example, excluding the outer circumferential portion of the uppermost resin layer (the fourth resin layer 23) composing the insulation layer.

A width $D_B$ on the upper surface of the fourth resin layer 23 not formed with the buffer layer explained above is preferably 20 µm or more. When the width $D_B$ is 20 µm or more, the buffer layer can be formed by preventing itself from being formed on other regions in the production steps.

The semiconductor device according to the above present embodiment is a SiP type semiconductor device of a type with bump connection via a buffer layer, wherein the reliability of secondary connection to the board is improved, wherein the first to fourth resin layers (20 to 23) forming the insulation layer are formed on regions excluding the outer circumferential portion of the semiconductor substrate 10a, and the buffer layer 24 is formed on a region not exceeding the formation region of a resin layer provided to have the largest area among the first to fourth resin layers (20 to 23). Namely, it is configured so that the outer circumferential portion of the semiconductor substrate 10a is formed with neither the insulation layer made by the first to fourth resin layers (20 to 23) nor the buffer layer 24.

Accordingly, since the insulation layer made by the first to fourth resin layers (20 to 23) and the buffer layer 24 are not formed on the scribe lines on the semiconductor wafer before dicing, curvature of the wafer is suppressed in the production steps.

Also, since the scribe lines can be visually recognized, dicing processing can be performed by using alignment marks on the scribe lines as targets; and the name of the production type written on the scribe lines can be seen, so that the type can be easily confirmed and so that a decline in workability can be prevented.

Furthermore, only the semiconductor substrate (wafer) is cut in the dicing processing, so that high throughput can be attained by heightening the dicing speed.

In the above explanation, the configuration of forming an electronic circuit including a semiconductor element, such as a transistor, on the semiconductor substrate 10a was explained, but it is not limited to this and may be configured so that a semiconductor chip having an electronic circuit formed therein including a semiconductor element, such as a transistor, is buried in the resin layers composed of the first to fourth resin layers (20 to 23) to be electrically connected to a wiring layer composed of the first to third wiring layers (30 to 35). In this case, the semiconductor substrate 10a may or may not have formed therein an electronic circuit in the same way as above.

Also, a part of the wiring layer composed of the first to third wiring layers (30 to 35) may configure a passive element, such as an electrostatic capacity element and inductance. For example, by combining these passive elements, for example, a low pass filter (LPF), a band pass filter (BPF) or a high pass filter (HPF), etc. can be configured. Alternately, by combining them with active elements provided to the electronic circuit, a so-called SiP type semiconductor device can be configured.

Next, a method of producing the above semiconductor device will be explained with reference to the drawings.

Figure 5A:
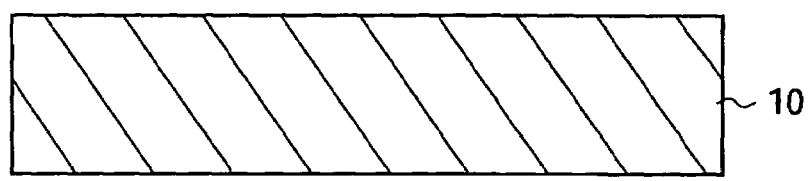
FIG. 5A to FIG. 5C are sectional views of production steps of the semiconductor device according to an embodiment of the present invention.

First, as shown in FIG. 5A, electronic circuits (not shown) including a transistor and other semiconductor element and corresponding to a plurality of semiconductor chips are formed to be integrated on the semiconductor wafer 10. Furthermore, electrodes (not shown) are formed on the surface of the semiconductor wafer 10 so as to be taken out from the electronic circuits.

Figure 5B:
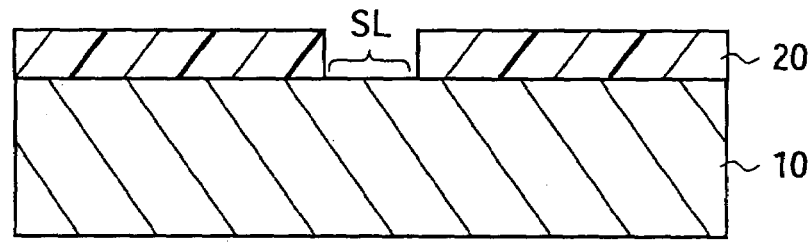

Next, as shown in FIG. 5B, except for a scribe line SL to be a dicing region, a pattern of the first resin layer 20 is formed, for example, to be a film thickness of 10 μm or so on the semiconductor wafer 10.

The first resin layer is formed by using a negative photosensitive resin material, such as a polyimide resin, an epoxy resin and an acrylic resin, by the spin coating method, the printing method or the CVD method, etc. and subjected to exposure by using a photomask, so that regions other than the scribe line are irradiated. When using, for example, a photosensitive polyimide resin, the exposure is performed by broadband exposure of covering lights of a g-line, an h-line and an i-line with energy of 300 mJ/cm$^2$. In the case of an epoxy resin, exposure is performed with energy of 2000 mJ/cm$^2$.

Furthermore, development processing is performed by using a 2.38% trimethylammonium hydroxide aqueous solution as a developing solution. Due to photosensitivity of the used resin, the scribe line SL opens in the development stage. Here, in the case of a negative photosensitive resin, because curing is proceeded by photoreaction, a pattern shape varies by an exposure condition and a development condition, but becomes a tapered opening shape.

The scribe line SL is formed to be a width of, for example, 78 μm.

Figure 5C:
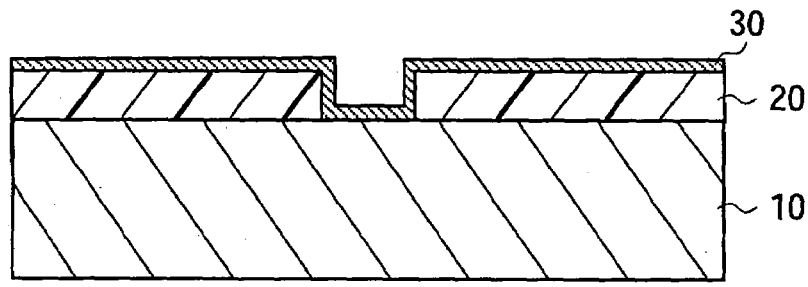

Next, as shown in FIG. 5C, a seed layer 30 is formed all over, for example, by the sputtering method. As a seed layer for plating copper, for example, a film of Ti/Cu is formed to be a film thickness of 160 nm/600 nm.

Figure 6A:
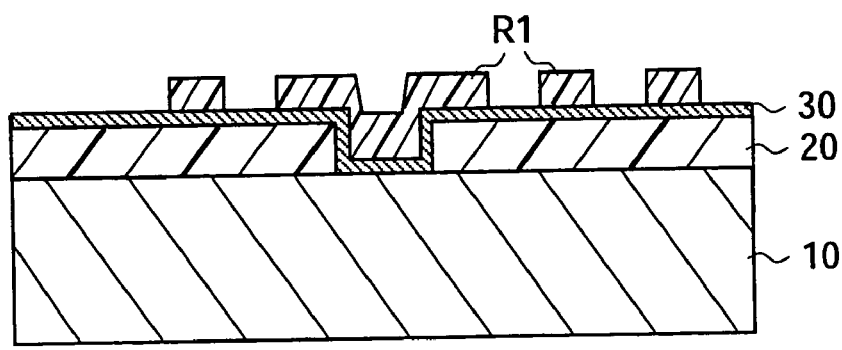
FIG. 6A to FIG. 6C are sectional views of production steps of the semiconductor device according to an embodiment of the present invention.

Next, as shown in FIG. 6A, a negative or positive resist film is formed on the seed layer 30, for example, by the spin coating; pattern exposure is performed by using a photomask, so that the pattern remains on regions other than formation regions of the first wiring layer in a predetermined wiring circuit pattern; and development processing is performed to form a pattern of the first resist film R1. The regions not formed with the first resist film R1 become formation regions of the first wiring layer. Since the first wiring layer is not formed on the scribe line SL, it is covered with the first resist film R1.

Figure 6B:
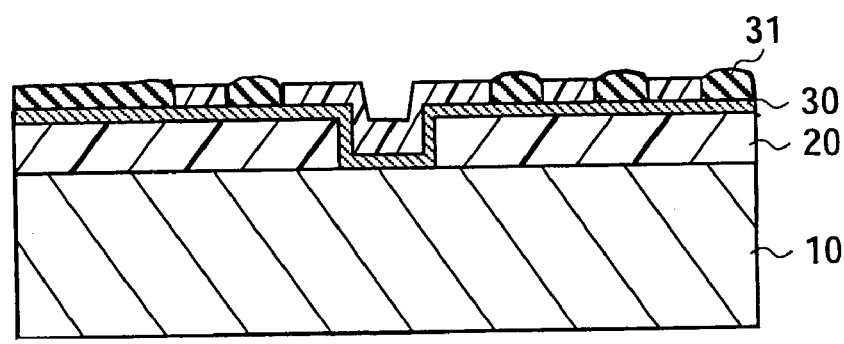

Next, as shown in FIG. 6B, a copper film is formed on regions other than the formation regions of the first resist film R1 by performing electroforming plating processing using the seed layer 30 as one electrode, and a copper plating layer 31 is formed in a predetermined wiring circuit pattern.

Figure 6C:
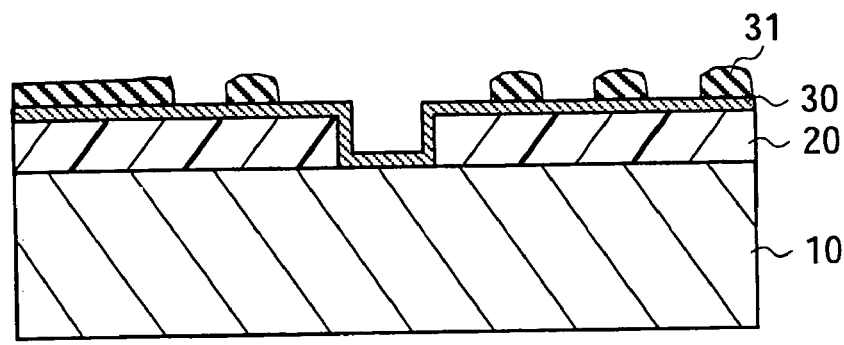
Figure 7A:
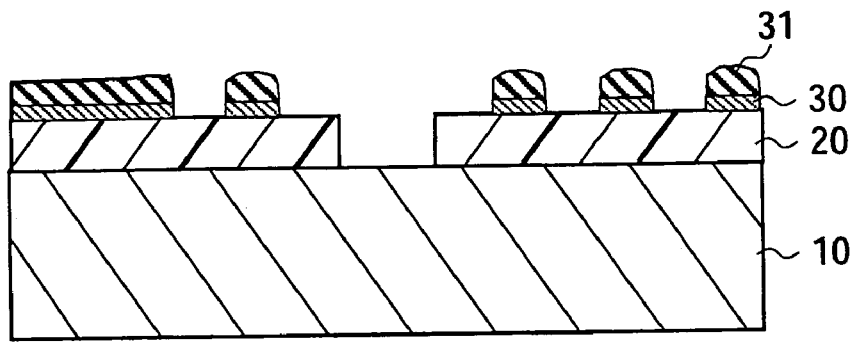
FIG. 7A to FIG. 7C are sectional views of production steps of the semiconductor device according to an embodiment of the present invention.

Next, as shown in FIG. 6C, the first resist film R1 is peeled by solvent processing, etc. to make the copper plating layer 31 exposed, wet etching, etc. is performed by using the copper plating layer 31 as a mask as shown in FIG. 7A, and the seed layer 30 between the copper plating layers 31 is removed in order to insulate. As a result, the first wiring layer composed of the seed layer 30 and the copper plating layer 31 is formed. While the first wiring layer is not shown in FIG. 7A, it is formed to be connected to electrodes (not shown) provided on the surface of the semiconductor wafer 10.

Figure 7B:
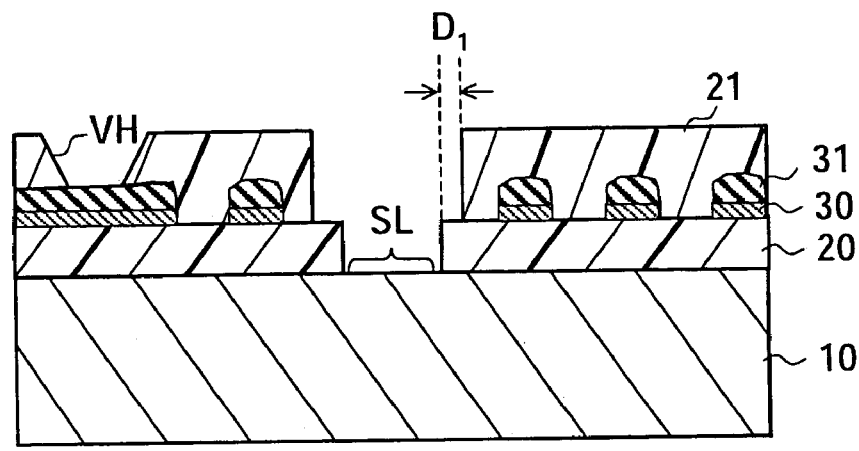

Next, as shown in FIG. 7B, except for the scribe line SL to be a dicing region and a via hole VH, a pattern of the second resin layer 21 is formed to be a film thickness of, for example, 10 μm or so on the first wiring layer (30, 31).

The second resin layer 21 can be formed by the same means and material as those of the first resin layer 20. In the step of forming the second resin layer 21, it is formed to have a smaller area than that of the first resin layer 20, so that a side surface and an upper surface of the first resin layer 20 and the second resin layer 21 form a stepwise shape.

On the stepwise formed portion, a width $D_1$ of the exposed upper surface of the first resin layer 20 being out of the second resin layer 21 is preferably 5 μm or more and is assumed to be, for example, 5 μm.

Also, the via hole VH connected to the first wiring layer (30, 31) can be formed in the same way.

Figure 7C:
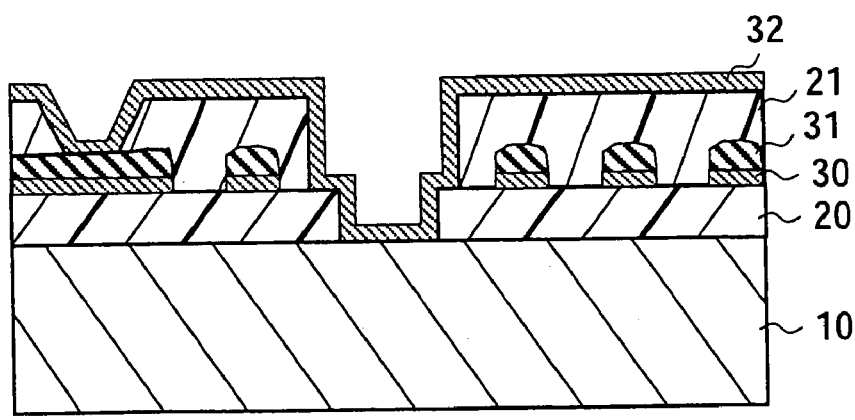

Next, as shown in FIG. 7C, a seed layer 32 is formed all over, for example, by the sputtering method in the same way as above.

Since the width $D_1$ of the exposed upper surface of the first resin layer 20 being out of the second resin layer 21 is 5 μm or more, coverage of the seed layer 32 covering the scribe line becomes preferable and the occurrence of step disconnection on the seed layer 32 can be prevented.

Figure 8A:
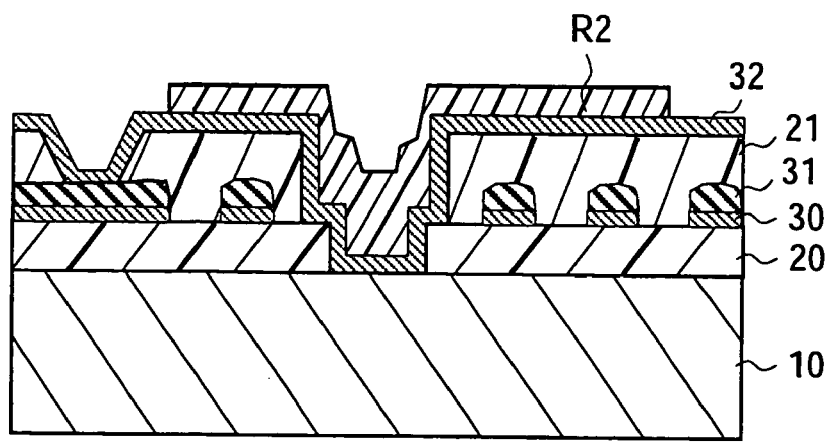
FIG. 8A to FIG. 8C are sectional views of production steps of the semiconductor device according to an embodiment of the present invention.

Next, as shown in FIG. 8A, a resist film is formed on the seed layer 32, for example, by spin coating, and a pattern of a second resist film R2 for protecting the scribe line SL and regions other than formation regions of the second wiring layer is formed.

Since the width $D_1$ of the exposed upper surface of the first resin layer 20 being out of the second resin layer 21 is 5 μm or more, coverage of the second resist film R2 covering the scribe line becomes preferable and the occurrence of step disconnection on the second resist film R2 can be prevented.

Figure 8B:
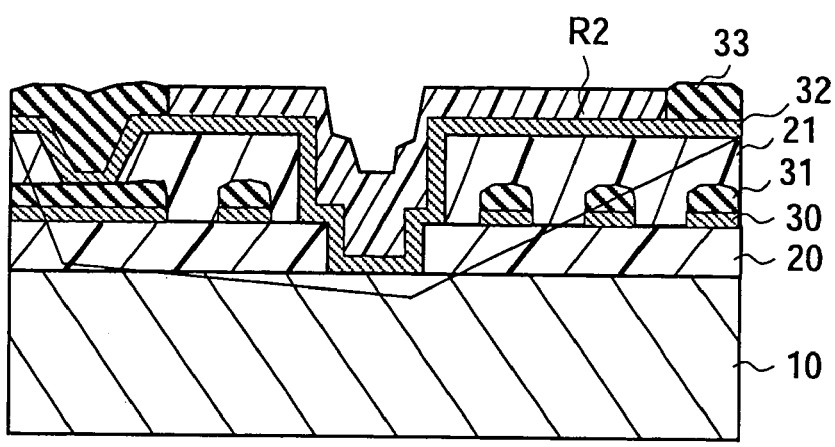

Next, as shown in FIG. 8B, electroforming plating processing is performed by using the seed layer 32 as one electrode to form a copper film on regions other than the formation regions of the second resist film R2, and a copper plating layer 33 is formed in a predetermined wiring circuit pattern.

Figure 8C:
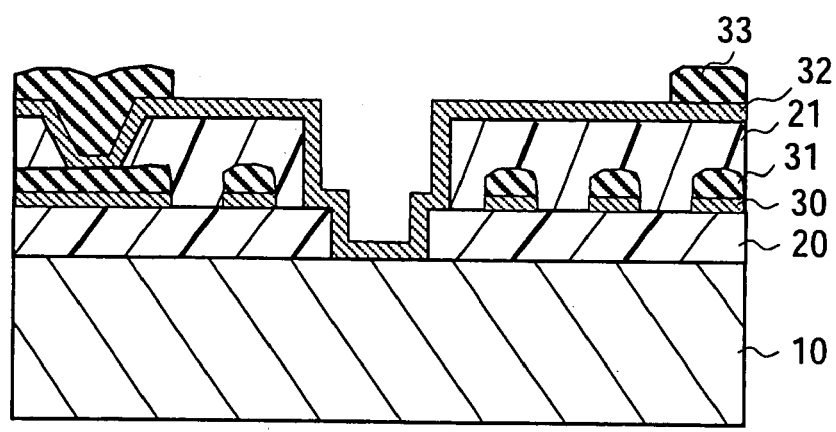
Figure 9A:
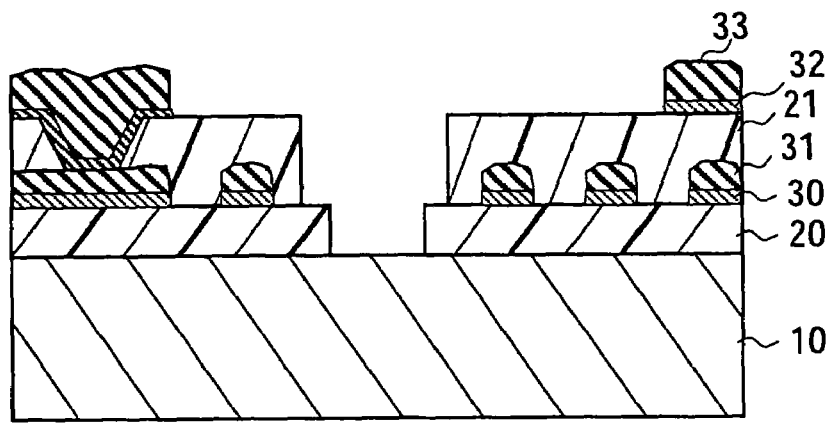
FIG. 9A to FIG. 9C are sectional views of production steps of the semiconductor device according to an embodiment of the present invention.

Next, as shown in FIG. 8C, the second resist film R2 is peeled, and the seed layer 32 between the respective copper plating layer 33 is removed by etching as shown in FIG. 9A to form a second wiring layer composed of the seed layer 32 and the copper plating layer 33. The second wiring layer is formed to be electrically connected to the first wiring layer via the via hole VH.

Figure 9B:
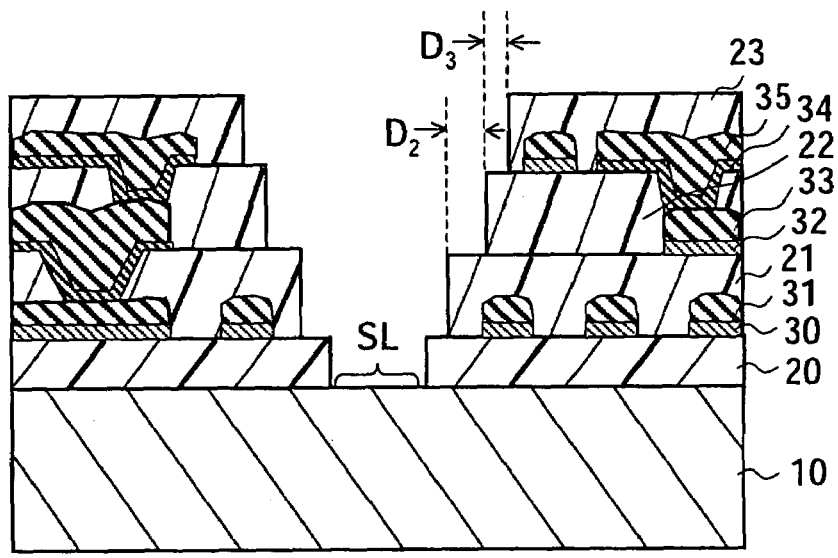

Next, as shown in FIG. 9B, by repeating the same steps as above, the third resin layer 22 and the fourth resin layer 23 are formed in the same way as the first resin layer 20 and the second resin layer 21, and the third wiring layer (34, 35) is formed in the same way as the first wiring layer (30, 31) and the second wiring layer (32, 33), respectively. The third wiring layer (34, 35) is formed to be connected to the second wiring layer (32, 33) in the via hole.

Here, in a step of forming the third resin layer 22, it is formed to have a smaller area than that of the second resin layer 21, so that a side surface and an upper surface of each of the second resin layer 21 and the third resin layer 22 form a stepwise shape. Also, in a step of forming the fourth resin layer 23, it is formed to have a smaller area than that of the third resin layer 22, and a width ($D_2$, $D_3$) of an exposed upper surface of a lower resin layer being out of its upper resin layer is 5 μm or more, for example 5 μm, so that a side surface and an upper surface of each of the third resin layer 22 and the fourth resin layer 23 form a stepwise shape.

As a result, coverage of the resist film covering the scribe line formed to be a pattern when plating the copper plating layers (31, 33 and 35) becomes preferable and the occurrence of step disconnection on the resist film can be prevented.

Next, a conductive post is formed by being connected to the first to third wiring layers (30 to 35) on the fourth resin layer 23 in the same way as above. At this time, the seed layer (not shown) remains unremoved.

Figure 9C:
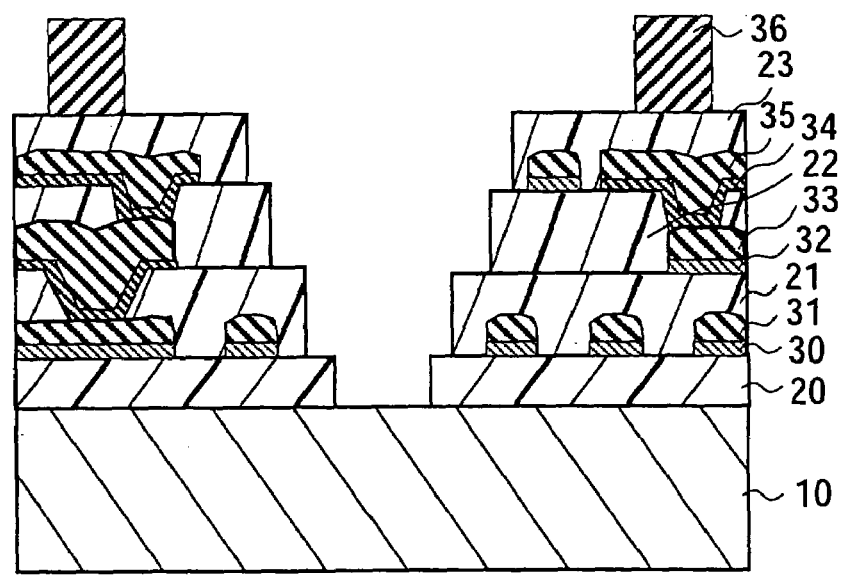

Next, as shown in FIG. 9C, for example, a photosensitive dry film is adhered thereto or a resist film is formed, an opening portion for the conductive post is formed by performing pattern exposure and development, and copper plating is performed by using the seed layer (not shown) formed on the fourth resin layer 23 as one electrode to form a conductive post 36 having a height of 100 to 150 μm and a diameter of 150 μm. After that, the dry film or the resist film is removed, furthermore, the seed layer (not shown) is peeled off. The conductive post preferably has an aspect ratio of 1 or less for preventing from falling down.

Unevenness of height of the surface of the conductive post made by copper is ±2.5% or so in one wafer surface.

Next, on the fourth resin layer 23 is formed a insulating buffer layer 24 for buffering a stress generated when the semiconductor device according to the present embodiment is mounted on the board by covering over the conductive post 36. As the buffer layer material, for example, a polyamideimide resin, a polyamide resin, an epoxy resin, a phenol resin or a polyparaphenylenebenzo-bis-oxazole resin, etc. is used.

Here, the buffer layer 24 is formed on the insulation layer on regions within a formation region of a resin layer provided to have the largest area among the first to fourth resin layers (20 to 23) composing the insulation layer.

For example, it is formed on regions excluding the outer circumferential portion of the uppermost resin layer (the fourth resin layer 23) among the first to fourth resin layers (20 to 23), for example, on regions excluding regions having a width of 20 μm on the outer circumferential portion.

To form the buffer layer 24 as above, for example, a printing method using a printing mask and a pressurized squeegee can be used.

Figure 10A:
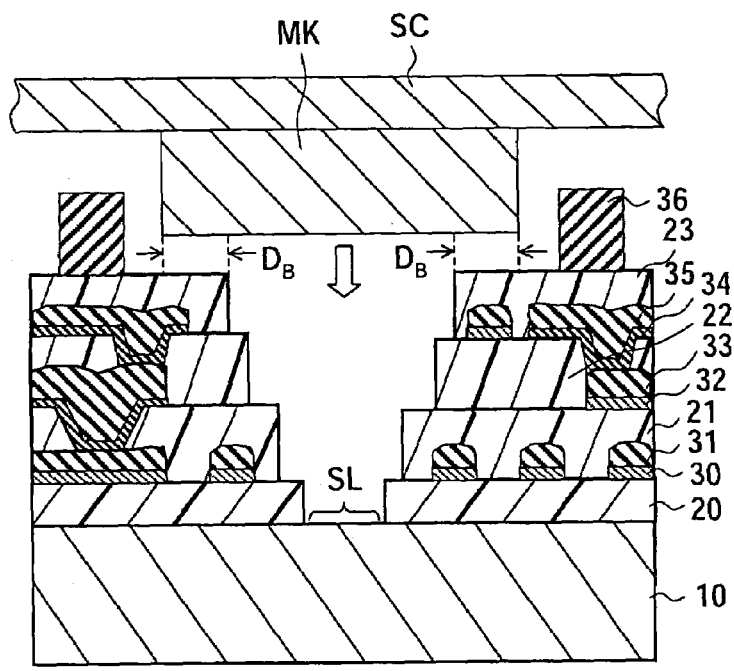
FIG. 10A is a sectional view of a step of arranging a printing mask by aligning with a semiconductor wafer.

FIG. 10A is a sectional view of a step of arranging the printing mask by aligning with the semiconductor wafer. For example, four alignment marks provided on the semiconductor wafer are used as reference to align the printing mask with the semiconductor wafer for arranging.

Figure 10B:
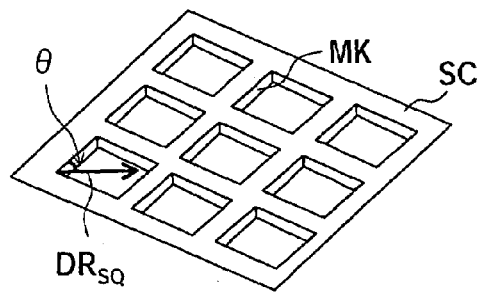
FIG. 10B is a perspective view of a printing mask.

Also, FIG. 10B is a perspective view of the printing mask. The printing mask has the configuration of combining a mesh screen SC having a thickness of 10 μm or less and a metal mask MK having a thickness equivalent to that of the buffer layer. The metal mask MK is configured by a plurality of-first metal masks spreading in the first direction and a plurality of second metal masks spreading in the orthogonal direction thereto.

As a result of the alignment of the semiconductor wafer and the mask, as shown in FIG. 10A, the metal mask MK is arranged along the scribe lines SL and made to contact on the width $D_B$, which is 20 μm or more from the outer circumference of the uppermost resin layer (the fourth resin layer 23).

Figure 10C:
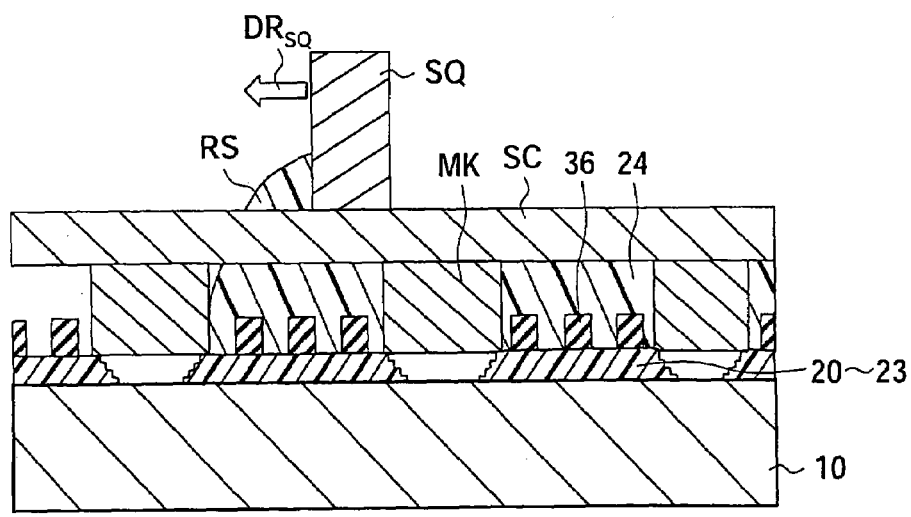
FIG. 10C is a sectional view of a step for forming a buffer layer by printing by using the printing mask.

FIG. 10C is a sectional view of a step of forming by printing the buffer layer by using the above printing mask.

As a resin material RS composing the buffer layer, for example, a polyamideimide resin having a viscosity of 130 Pa.s is supplied on a mesh screen SC, the squeegee SQ is applied with a pressure of $1 \times 10^5$ to $1 \times 10^6$ Pa, and printing is performed so that the squeegee SQ is slid at a speed of 5 to 10 mm/s in the direction $DR_{SQ}$ of crossing by an angle of 45° with the spreading direction of the first metal mask and that of the second metal mask. Consequently, it is possible to prevent the printing mask from being damaged by the pressure applied at the time of printing, and it is also possible to prevent the buffer layer from entering to other regions.

As a result, as explained above, the insulating buffer layer 24 for covering over the conductive post 36 and buffering stress generated at the time the semiconductor device according to the present embodiment is mounted on a board is formed.

At this time, since the metal mask ML is made to contact on the width $D_B$ that is 20 μm or more from the outer circumference of the fourth resin layer 23, it is possible to prevent the buffer layer from being formed by entering to other regions. The width $D_B$ can be suitably changed in accordance with viscosity of a resin material RS composing the buffer layer.

In the printing step of the buffer layer, printing can be divided to two or more times, so that a sufficient film thickness can be obtained by performing printing for two or more times even when a sufficient film thickness cannot be obtained by performing once.

Also, it is preferable to print buffer layer materials having different a viscosity for two or more times. At this time, it is preferable that a buffer layer material with lower viscosity is printed first, then, a buffer layer material with higher viscosity is printed. By printing the buffer layer material with a low viscosity first, it is possible to prevent voids from being formed around the conductive post, etc.

When the arrangement of the copper conductive post 36 is an area array or in pitches of 0.3 mm or less, voids appearing near the conductive post can be suppressed by setting the mask thickness to be thin, making a bank portion along the scribe line of the metal mask wider, and making viscosity of the buffer layer material to be 100 Pa·s or less.

After forming the buffer layer as explained above, for example, pre-bake processing at 50 to 100° C. is performed for 15 minutes to evaporate a solvent in the buffer layer material, so that the buffer layer is cured.

As the pre-baking treatment, for example, pre-baking treatment performed by changing the temperature and pre-baking treatment performed by changing the atmosphere are preferable.

Specifically, it is preferable to include pre-baking treatment performed in a state where vaporization of a solvent from the buffer layer is prevented in evaporation and to include pre-baking treatment performed in a state of, for example, covering the entire semiconductor-wafer with a lid. For example, when performing by three steps of 50° C., 70° C. and 100° C., a lid is provided to a hotplate at 50° C. and the entire wafer is covered with the lid to prevent and suppress vaporization of the solvent. As explained above, by making voids flowing by baking at a low temperature, the voids can be eliminated. After that, the lid is removed to accelerate vaporization of the solvent and the processing is performed by raising the temperature to 70° C. and 100° C. When the vaporization proceeds, the voids stop to flow.

Figure 11A:
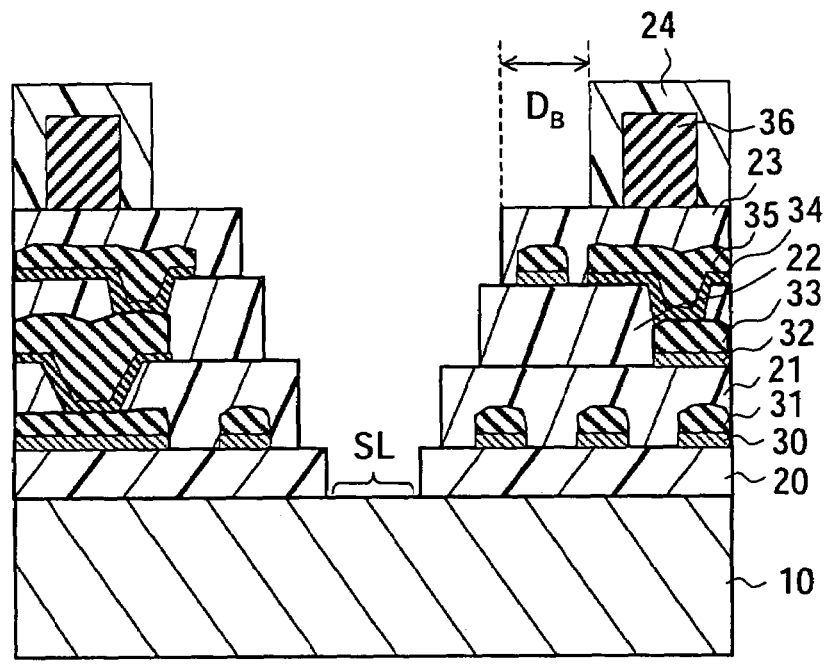
FIG. 11A and FIG. 11B are sectional views of production steps of the semiconductor device according to an embodiment of the present invention.
Figure 11B:
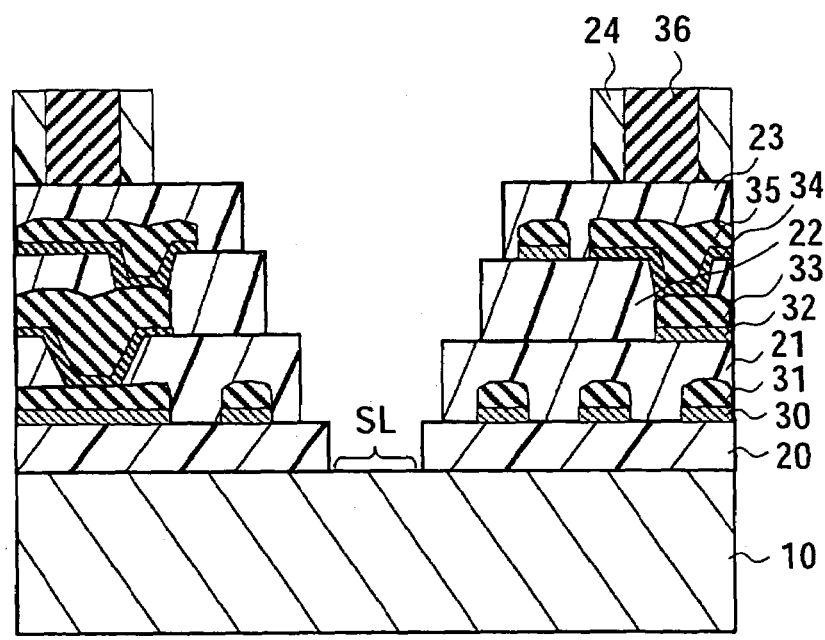

As explained above, as shown in FIG. 11A, after forming the buffer layer 24 on a region excluding a region ($D_B$) on the fourth resin layer 23 by covering the conductive post 36, then a top of the conductive post 36 is made to be exposed by polishing after curing the buffer layer 24, as shown in FIG. 11B. As a result, the buffer layer 24 is formed on the outer circumferential portion of the conductive post 36 but on the insulation layer of a region not exceeding a formation region of a resin layer having the largest area among the first to fourth resin layers (20 to 23).

Conditions at this time include, for example, using a wheel (whetstone) of #600, a spindle rotary number of 1500 rpm, and a feeding speed of not more than (0.2 mm/s+0.1 mm/s. As a result, the copper conductive post and the buffer layer are uniformly polished to have a flat surface.

Figure 12A:
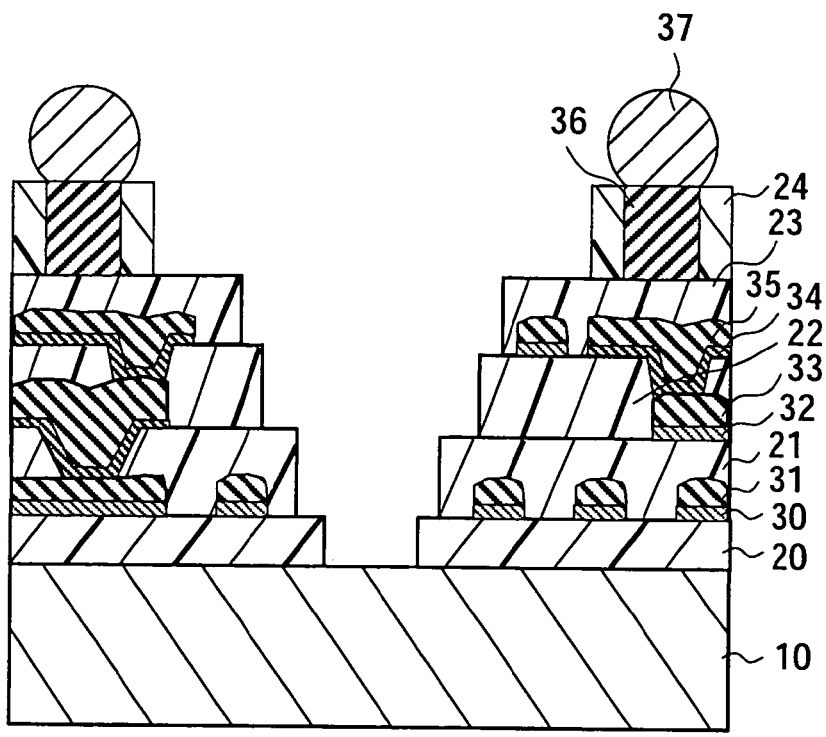
FIG. 12A and FIG. 12B are sectional views of production steps of the semiconductor device according to an embodiment of the present invention.

Next, as shown in FIG. 12A, a bump (projecting electrode) 37 is formed by mounting a solder ball, LGA, or printing of solder bump so as to be connected to the conductive post 36.

In the case of printing a solder bump, for example, lead-free solder is printed to have a diameter of 0.2 mm, and subjected to re-flow at a temperature of 260° C. or less, so that a bump is formed.

Figure 12B:
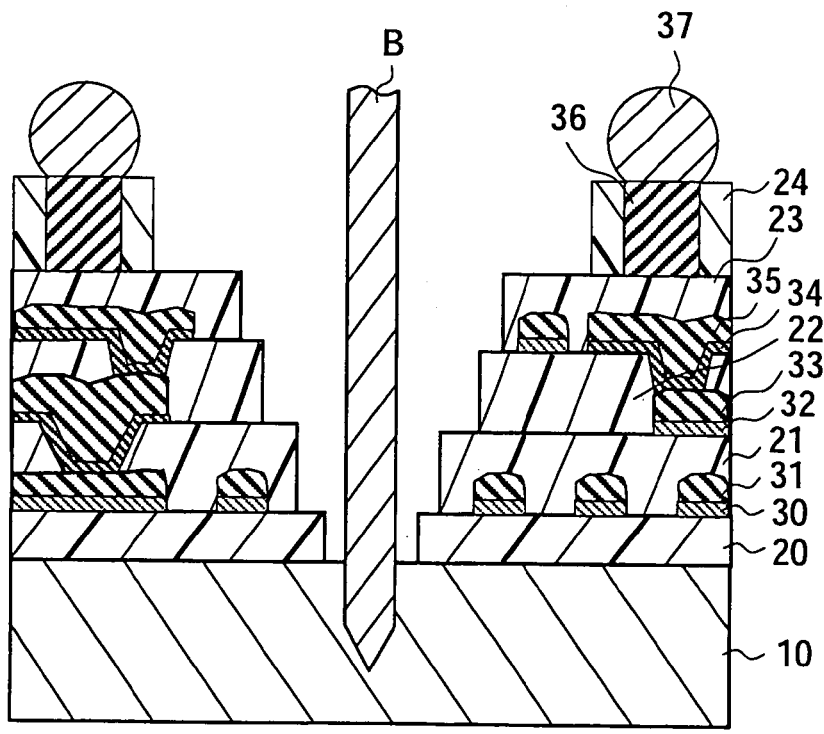

Next, as shown in FIG. 12B, the semiconductor wafer 10 is subjected to half cut dicing along the scribe line by using a dicing blade B (the blade rotation rate is 3000 rpm) and polishing the back surface, so that it can be cut into respective semiconductor chip 10a. Alternately, it may be made into pieces by full-cut dicing.

Here, the first to fourth resin layers (20, 21, 22 and 23) are not formed on the semiconductor wafer 10 on the scribe line, furthermore, the buffer layer 24 is also not formed, the upper surface of the semiconductor wafer 10 is exposed, and only the semiconductor wafer is cut so that it is not necessary to cut the resin layers and so that it is not necessary to select a special blade, either.

As explained above, a semiconductor device made into a piece shown in FIG. 4 is obtained.

In the above explanation, in the case of forming a semiconductor chip having an electronic circuit formed therein including a semiconductor element, such as a transistor, by burying the same in a resin layer composed of the first to fourth resin layers (20 to 23), it is mounted by using a die-attach film, etc., buried into a predetermined resin layer, and electrically connecting to the wiring layer composed of the first to third wiring layers (30 to 35) via a via hole to a pad of a semiconductor chip. In this case, an electronic circuit may be formed in the same way as the above or not formed on the semiconductor substrate 10a.

According to the method of producing the semiconductor device according to the present embodiment explained above, in a method of producing a SiP type semiconductor device of a type with bump connection via the buffer layer, wherein reliability of secondary connection with the board is improved, the first to fourth resin layers (20 to 23) composing the insulation layer are formed on the semiconductor wafer surface excluding the scribe line, and the buffer layer 24 is formed on a region not exceeding a formation region of a resin layer having the largest area among the first to fourth resin layers (20 to 23); so that none of the first to fourth resin layers (20 to 23) nor the buffer layer 24 are formed on the scribe line on the semiconductor wafer before dicing. Thus, curvature of the wafer is suppressed in the production steps.

Also, since the scribe line can be seen in the dicing step, the dicing processing can be performed by using alignment marks on the scribe line as a target and a name of the production type written on the scribe line can be also seen, so that the type can be easily confirmed and a decline in workability can be prevented.

Furthermore, it is only the semiconductor substrate (wafer) that is cut in the dicing step, so that the dicing speed can be made high and high throughput can be attained.

MODIFIED EXAMPLE

In the above production method, although an explanation was provided of an example of forming the buffer layer 24 on a region excluding the outer circumferential portion of the uppermost resin layer among the first to fourth resin layers (20 to 23), the present invention is not limited to this and the buffer layer 24 can be formed on the insulation layer on a region not exceeding the formation region of a resin layer having the largest area among the first to fourth resin layers (20 to 23) composing the insulation layer.

Figure 13A:
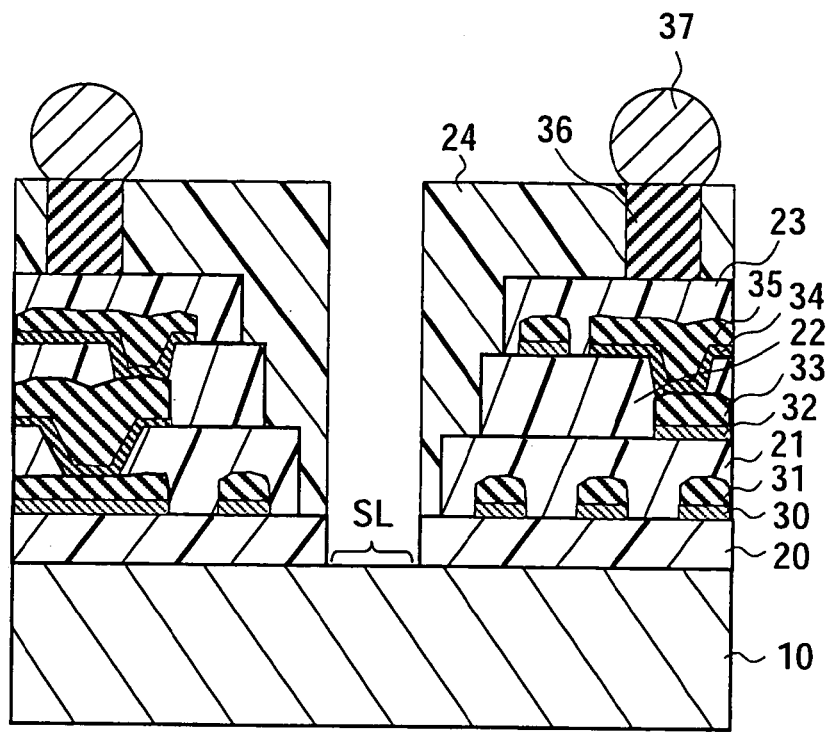
FIG. 13A and FIG. 13B are sectional views of production steps of a semiconductor device according to a modified example of the present invention.

FIG. 13A shows a state where the buffer layer 24 is formed on the insulation layer (the first to fourth resin layers (20 to 23)) in a region within a formation region of a resin layer having the largest area among the first to fourth resin layers (20 to 23) composing the insulation layer as explained above, that is the first resin layer 20.

By forming the buffer layer 24 as above, since none of the insulation layers of the first to fourth resin layers (20 to 23) and the buffer layer 24 are formed on the scribe line on the semiconductor wafer before dicing, curvature of the wafer is suppressed in the production step.

Figure 13B:
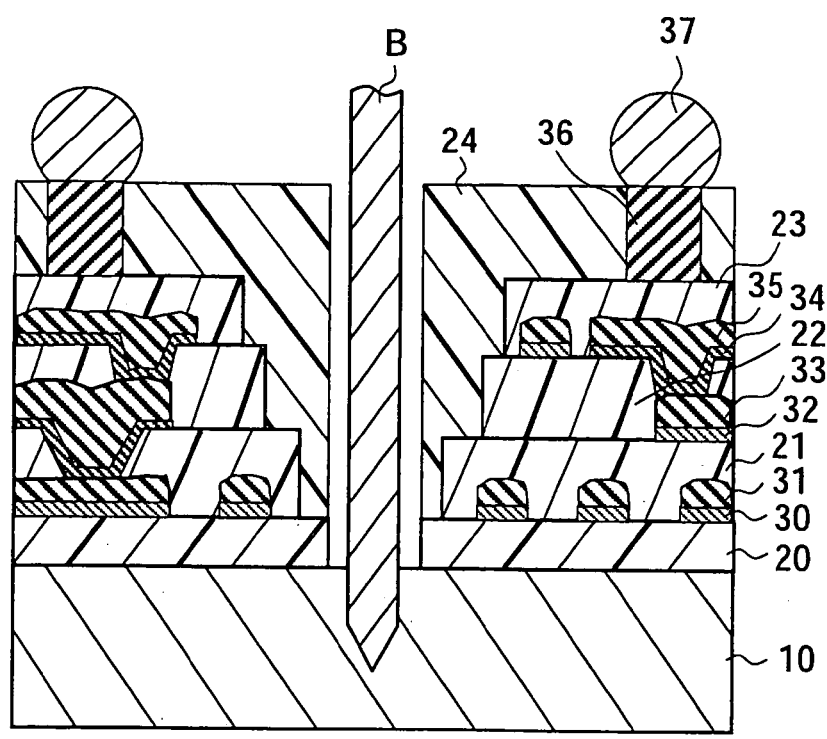

Also, in the dicing step shown in FIG. 13B, as in the step shown in FIG. 12B, the dicing processing can be performed by using the alignment mark on the scribe line as a target and a name of the production type written on the scribe line can be seen, so that the type can be easily confirmed and a decline in workability can be prevented.

Furthermore, it is only the semiconductor substrate (wafer) that is cut in the dicing step, so that the dicing speed can be made high and high throughput can be attained.

According to the method of producing the semiconductor device according to the present embodiment, the advantages listed below can be obtained.

(1) By stacking a resin layer and a buffer layer excluding the scribe line when stacking them on the wafer level, curvature of the semiconductor wafer can be prevented without using a resin layer material of special properties. For example, curvature of the entire wafer of an 8-inch wafer composed of five stacked layers of a resin layer is measured as a distance from a reference surface of one end portion when suppressing the other end portion to the reference surface, and it can be suppressed to 600 μm or less. Due to the reduction of curvature, an adsorption error, etc. can be prevented in the production apparatus, and unevenness of thickness after being made into pieces can be suppressed to 10% or less.

(2) Since film thickness of the resin layer and buffer layer stacked on the surface excluding the scribe line causes curvature in the wafer, the resin layer and buffer layer can be made thicker compared to the configuration which does not exclude the scribe line. Namely, when assuming that the film thickness of one resin layer is not changed, the number of resin layers to be stacked can be increased.

(3) When using resin layers having the same property values, only widening the scribe line contributes to a reduction of curvature of the wafer.

(4) It is only the semiconductor wafer that is cut in the dicing step and it is not necessary to cut the resin layers, so that it is not necessary to select a special blade. Furthermore, since the semiconductor wafer and resin layers are hard to separate at the time of dicing, adjustment of a feeding speed of a blade also becomes unnecessary. Thus, it can be made, for example, as high as 80 to 100 mm/s or so, so that high throughput can be attained.

(5) Since the scribe line is always exposed in the dicing step, alignment of the scribe line can be automatically controlled.

(6) Since the scribe line is always exposed, identification becomes easy by writing SiP type information, etc. on the scribe line.

The present invention is not limited to the above embodiments.

For example, in a step of forming resin layers by stacking on a semiconductor substrate or in a step of forming wiring layers on the boundaries thereof, an electronic device and/or a semiconductor chip may be formed by being buried so as to be electrically connected to a wiring layer on or under it.

Also, although in the above described embodiments the resin layer has four stacked layers, the number of layers is not limited to this, such that the stacked body may have two layers, three layers, five or more layers.

Other than the above, the present invention may be variously modified within the scope of the present invention.

A semiconductor device of the present invention can be applied to a system-in-package type semiconductor device.

Also, a method of producing a semiconductor device of the present invention can be applied for producing a system-in-package type semiconductor device.

What is claimed is:

1. A semiconductor device including and packaging a semiconductor having an electronic circuit formed therein and used when mounted on a board, comprising:
    a substrate;
    an insulation layer formed of a plurality of resin layers stacked on the substrate on a region other than an outer circumferential portion of the substrate;
    a plurality of wiring layers formed to be electrically connected to the electronic circuit and respectively buried in at least one of the plurality of resin layers forming said insulation layers;
    an insulating buffer layer formed on an uppermost one of the plurality of resin layers forming the insulation layer on a region not exceeding a formation region of the resin layer formed with the largest area among the plurality of the resin layers, and for buffering a stress which is generated when mounted on the board;
    a conductive post formed through the insulating buffer layer to be electrically connected to the wiring layer; and
    a projecting electrode formed projecting from a surface of the insulating buffer layer to be electrically connected to the conductive post.

2. A semiconductor device as set forth in claim 1, wherein the insulating buffer layer is formed on an uppermost resin layer on a region excluding an outer circumferential portion of the top resin layer among the plurality of the resin layers.

3. A semiconductor device as set forth in claim 2, wherein the insulating buffer layer is formed on a region excluding a region having a width of 20 μm or more at the outer circumferential portion of the top resin layer.

4. A semiconductor device as set forth in claim 1, wherein the plurality of the resin layers are formed, so that as they get farther from the substrate, their formation areas become gradually smaller from an area of an upper surface of the substrate, and
    a side surface and an upper surface of each of the resin layers and the upper surface of the substrate respectively form a stepwise shape.

5. A semiconductor device as set forth in claim 1, wherein the substrate is a semiconductor substrate, and has the electronic circuit formed therein to be electrically connected to at least one of the plurality of the wiring layers.

6. A semiconductor device as set forth in claim 1 wherein said insulating buffer layer is formed on a region not exceeding a formation region of the one of the plurality of resins layers having the largest area on the plurality of resins layers forming the insulation layer.

7. A semiconductor device as set forth in claim 1, wherein the insulation layer comprising the plurality of resin layers and the buffer layer are not formed on a scribe line on a semiconductor wafer comprising said substrate before dicing, whereupon curvature of the semiconductor wafer is suppressed during production.

* * * * *

UNITED STATES PATENT AND TRADEMARK OFFICE
CERTIFICATE OF CORRECTION

PATENT NO. : 7,157,796 B2  Page 1 of 1
APPLICATION NO. : 10/989395
DATED : January 2, 2007
INVENTOR(S) : Osamu Yamagata It is certified that error appears in the above-identified patent and that said Letters Patent is hereby corrected as shown below:

Column 14, Line 46, Claim 6:
"resins layers having" should read -- resin layers having --.

Column 14, Lines 46-47, Claim 6:
"resins layers forming" should read -- resin layers forming --.

Signed and Sealed this

Twelfth Day of June, 2007

JON W. DUDAS
*Director of the United States Patent and Trademark Office*